United States Patent
Almeida

(10) Patent No.: US 12,287,573 B2
(45) Date of Patent: Apr. 29, 2025

(54) METHOD OF REPLICATING A MICROSTRUCTURE PATTERN

(71) Applicant: VIAVI SOLUTIONS INC., San Jose, CA (US)

(72) Inventor: Riberet Almeida, Rochester, NY (US)

(73) Assignee: VIAVI SOLUTIONS INC., Chandler, AZ (US)

(*) Notice: Subject to any disclaimer, the term of this patent is extended or adjusted under 35 U.S.C. 154(b) by 0 days.

(21) Appl. No.: 17/338,144

(22) Filed: Jun. 3, 2021

(65) Prior Publication Data

US 2022/0390839 A1 Dec. 8, 2022

(51) Int. Cl.
*G03F 7/00* (2006.01)
*G03F 7/09* (2006.01)

(52) U.S. Cl.
CPC .......... *G03F 7/0035* (2013.01); *G03F 7/0002* (2013.01); *G03F 7/094* (2013.01)

(58) Field of Classification Search
CPC ....... G03F 7/0035; G03F 7/0002; G03F 7/094
See application file for complete search history.

(56) References Cited

U.S. PATENT DOCUMENTS

| | | | |
|---|---|---|---|
| 4,575,636 A | 3/1986 | Caprari | |
| 6,027,595 A * | 2/2000 | Suleski | B82Y 40/00 156/289 |
| 8,480,942 B2 * | 7/2013 | Shannon | B82Y 10/00 264/482 |
| 8,563,438 B2 * | 10/2013 | Maekawa | B82Y 10/00 438/689 |
| 9,821,507 B2 * | 11/2017 | Saha | B29C 71/02 |
| 2003/0071016 A1 | 4/2003 | Shih et al. | |
| 2003/0190803 A1 | 10/2003 | Harchanko et al. | |
| 2005/0282402 A1 | 12/2005 | Kim | |
| 2007/0020829 A1 | 1/2007 | Hotta et al. | |
| 2007/0059497 A1 | 3/2007 | Huang et al. | |
| 2008/0003818 A1 | 1/2008 | Seidel et al. | |

(Continued)

FOREIGN PATENT DOCUMENTS

| | | | | |
|---|---|---|---|---|
| CN | 102591140 A | * | 7/2012 | B82Y 10/00 |
| EP | 1533657 B1 | * | 3/2011 | B29C 33/60 |

(Continued)

OTHER PUBLICATIONS

Kim, Woo-Soo, Keun Byoung Yoon, and Byeong-Soo Bae. "Nanopatterning of photonic crystals with a photocurable silica-titania organic-inorganic hybrid material by a UV-based nanoimprint technique." Journal of Materials Chemistry 15 (42): 4535-4539. (Year: 2005).*

(Continued)

*Primary Examiner* — Mark F. Huff
*Assistant Examiner* — Moriah S. Smoot
(74) *Attorney, Agent, or Firm* — Mannava & Kang, P.C.

(57) ABSTRACT

A method includes providing a first multilayer structure including a substrate, a thin film, and a first photoresist layer; providing a second multilayer structure including a mold having a microstructure pattern, and a second photoresist layer; combining the first multilayer structure and the second multilayer structure so that the first photoresist layer is in contact with the second photoresist layer; and applying pressure and temperature. An article including a microstructure pattern is also disclosed.

18 Claims, 5 Drawing Sheets

(56) References Cited

U.S. PATENT DOCUMENTS

| | | |
|---|---|---|
| 2008/0157438 A1 | 7/2008 | Song |
| 2008/0285428 A1 | 11/2008 | Sewell |
| 2009/0136657 A1 * | 5/2009 | Slafer .................... C25D 5/022 427/124 |
| 2009/0139960 A1 | 6/2009 | Kim et al. |
| 2010/0230864 A1 | 9/2010 | Park et al. |
| 2010/0308512 A1 * | 12/2010 | Zhu .......................... C08L 63/00 264/225 |
| 2014/0109785 A1 | 4/2014 | Pauliac |
| 2015/0298365 A1 * | 10/2015 | Yukawa .................. G03F 7/038 522/6 |
| 2022/0390833 A1 * | 12/2022 | Almeida ............... G03F 7/0002 |

FOREIGN PATENT DOCUMENTS

| | | | | |
|---|---|---|---|---|
| JP | H09274425 A | | 10/1997 | |
| JP | 2006098790 A | | 4/2006 | |
| JP | 3892457 B2 | * | 3/2007 | ............ B29C 33/60 |
| JP | 2009190300 A | | 8/2009 | |
| JP | 2009226750 A | | 10/2009 | |
| JP | 4693451 B2 | | 6/2011 | |
| JP | 2011116032 A | | 6/2011 | |
| KR | 10-2007-0011253 A | | 1/2007 | |
| KR | 10-2008-0051922 A | | 6/2008 | |
| KR | 20080097499 A | * | 11/2008 | ........... G03F 7/0002 |
| KR | 10-0879790 B1 | | 1/2009 | |
| KR | 10-2011-0128753 A | | 11/2011 | |
| TW | I389931 | * | 3/2013 | ............ B29C 59/02 |
| TW | I389931 B | * | 3/2013 | |
| WO | WO-2006066016 A2 | * | 6/2006 | ........... B81C 99/009 |
| WO | WO-2017148575 A1 | * | 9/2017 | ........... B42D 25/324 |

OTHER PUBLICATIONS

Borzenko, T., et al. "Polymer bonding process for nanolithography." Applied Physics Letters 79.14 (2001): 2246-2248. (Year: 2001).*

Kim, Woo-Soo, Keun Byoung Yoon, and Byeong-Soo Bae (2005). Nanopatterning of photonic crystals with a photocurable silica-titania organic-inorganic hybrid material by a UV-based nanoimprint technique. Journal of Materials Chemistry, 15(42), 4535-4539. (Year: 2005).*

Borzenko, T., et al. "Imprint with sharp tip stamps." Microelectronic engineering 57 (2001): 389-396 (Year: 2001).*

Elsayed, Maha, and Olivia M. Merkel. "Nanoimprinting of topographical and 3D cell culture scaffolds." Nanomedicine 9.2 (2014): 349-366. (Year: 2014).*

Luan, Shifang, et al. "Solvent-assisted polymer-bonding lithography." Journal of Vacuum Science & Technology B: Microelectronics and Nanometer Structures Processing, Measurement, and Phenomena 23.1 (2005): 236-241. (Year: 2005).*

Colburn, Matthew, et al. "Step and flash imprint lithography: a new approach to high-resolution patterning." Emerging Lithographic Technologies III. vol. 3676. SPIE. (Year: 1999).*

Scheer, Hella-C., et al. "Nanoimprint techniques." Handbook of Thin Films. Academic press, 1-60. (Year: 2002).*

Lou, Kevin, et al. "A study of thermoplastic properties of a novel photoresist." 10th IEEE International Conference on Nano/Micro Engineered and Molecular Systems. IEEE, 2015. (Year: 2015).*

Khalid Dhima, "Hybrid Lithography-The combination of T-NIL & UV-L", Dissertation, Mar. 25, 2015, 185 pages.

* cited by examiner

METHOD OF REPLICATING A MICROSTRUCTURE PATTERN

FIELD OF THE INVENTION

The present disclosure generally relates to a method includes providing a first multilayer structure including a substrate, a thin film, and a first photoresist layer; providing a second multilayer structure including a mold having a microstructure pattern, and a second photoresist layer; combining the first multilayer structure and the second multilayer structure so that the first photoresist layer is in contact with the second photoresist layer; and applying pressure and temperature. An article including the microstructure pattern is also disclosed.

BACKGROUND OF THE INVENTION

Polymer-on-glass replication processes or stamping processes can be used to create diffuser structures. It is desirable to have a zero-base portion or a base portion with a negligible thickness, e.g., in the order of hundreds of nanometers) of a polymer layer when following with an etching process. For an etch process following a replication of a microstructure, the etch process window needs to be centered around the indentions/protrusions of the microstructures in the polymer layer. It is difficult to control the base portion of the polymer layer after replication, which makes a subsequent etch process of a thin film, such as a high refractive index material, hard to control.

BRIEF DESCRIPTION OF THE DRAWINGS

Features of the present disclosure are illustrated by way of example and not limited in the following figure(s), in which like numerals indicate like elements, in which.

SUMMARY OF THE INVENTION

Figure 1A:
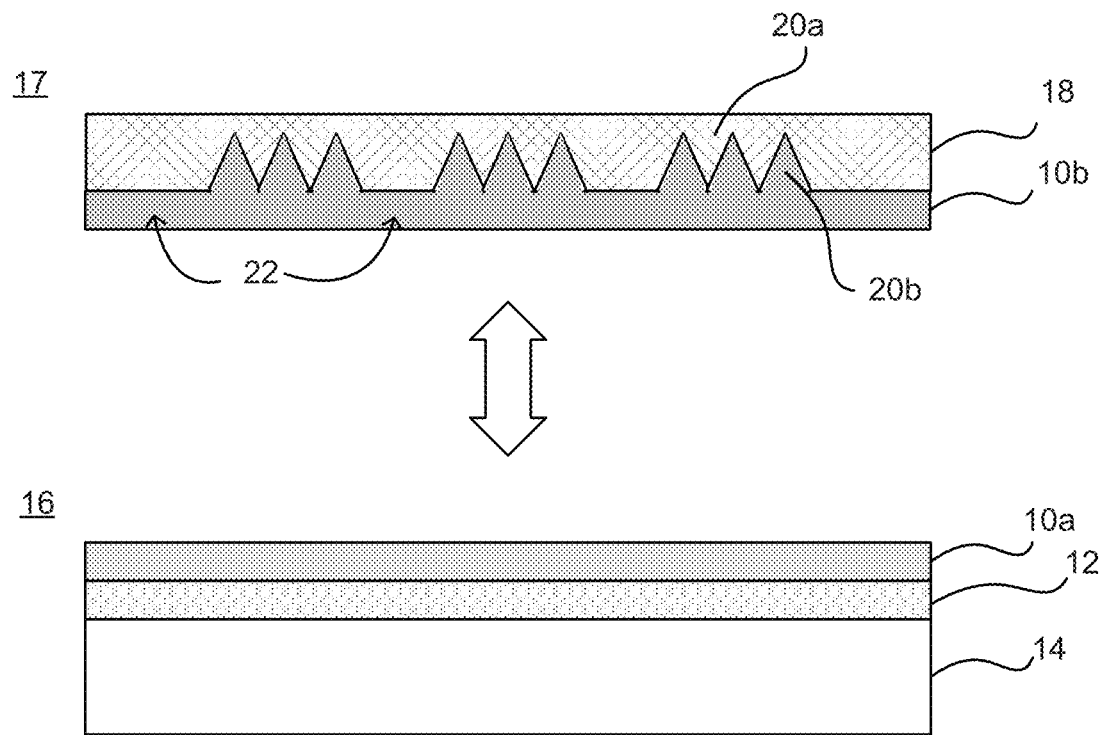
FIG. 1A illustrates a first multilayer structure and a second multilayer structure according to an aspect of the invention.

In an aspect, there is disclosed a method of replicating a microstructure pattern comprising providing a multilayer structure including a substrate, a thin film, and a positive tone photoresist; providing a thermally conductive mold having a microstructure pattern; applying the thermally conductive mold to the multilayer structure under pressure and temperature; wherein the microstructure pattern of the thermally conductive mold is replicated onto the positive tone photoresist of the multilayer structure.

In another aspect, there is disclosed an article including a substrate, and a thin film having a microstructure pattern.

Additional features and advantages of various embodiments will be set forth, in part, in the description that follows, and will, in part, be apparent from the description, or can be learned by the practice of various embodiments. The objectives and other advantages of various embodiments will be realized and attained by means of the elements and combinations particularly pointed out in the description herein.

DETAILED DESCRIPTION OF THE INVENTION

For simplicity and illustrative purposes, the present disclosure is described by referring mainly to an example thereof. In the following description, numerous specific details are set forth in order to provide a thorough understanding of the present disclosure. It will be readily apparent however, that the present disclosure ay be practiced without limitation to these specific details. In other instances, some methods and structures have not been described in detail so as not to unnecessarily obscure the present disclosure.

Additionally, the elements depicted in the accompanying figures may include additional components and some of the components described in those figures may be removed and/or modified without departing from scopes of the present disclosure. Further, the elements depicted in the figures may not be drawn to scale and thus, the elements may have sizes and/or configurations that differ from those shown in the figures.

It is to be understood that both the foregoing general description and the following detailed description are exemplary and explanatory only, and are intended to provide an explanation of various embodiments of the present teachings. In its broad and varied embodiments, disclosed herein are articles; and a method of making and using articles.

The present disclosure describes a method includes providing a first multilayer structure 16 including a substrate 14, a thin film 12, and a first photoresist layer 10a; providing a second multilayer structure 17 including a mold 18 having a microstructure pattern 20a, and a second photoresist layer 10b; combining the first multilayer structure 16 and the second multilayer structure 17 so that the first photoresist layer 10a is in contact with the second photoresist layer 10b; and applying pressure and temperature.

The second microstructure layer 17 can include a mold 18 having a microstructure pattern 20a and a second photoresist layer 10b. The mold 18 can be made of a material capable of receiving and retaining a microstructure pattern 20a. Non-limiting examples of a material include metal; a semiconductor; a dielectric, such as nickel, silicon, fused silica, etc.; glass; quartz; and combinations thereof. In an aspect, the mold 18 can be made of a conductive material. In another aspect, the mold 18 can be made of a thermally conductive material.

The microstructure pattern 20a can be a random or a periodic pattern. In an aspect, the microstructure pattern 20a can be a binary pattern. In another aspect, the microstructure pattern 20a can be a gray-scale non-binary pattern. The microstructure pattern 20a can include a variety of shapes, forms, images, indentations, protrusions, and combinations thereof, in a variety of sizes. The microstructure pattern 20a can include uniform portions and irregular portions. For example, as shown in FIG. 1A, the microstructure pattern 20a includes three separate portions of triangular-shaped indentations that are uniformly separated one from another by planar sections.

In an aspect, the mold 18 can include a release agent (not shown), applied as a coating, on the microstructure pattern 20a. The release agent can be a low surface energy fluoropolymer or a hydrophobic self-assembled-monolayer, such as a hydrophobic silane. The release agent can be applied to the mold in any deposition process that can deposit the release agent in the indentations/protrusions, etc. of the microstructure pattern 20a. Non-limiting examples of a suitable deposition process include spin coating; dip coating; chemical vapor deposition; physical vapor deposition, such as sputter or thermal evaporation; and a physical application, such as buffing a surface of the microstructure pattern 20a with the release agent.

The second photoresist layer 10b, of the second multilayer structure 17, can have a replicated microstructure pattern 20b, and a base portion 22, of the second photoresist layer 10b, that does not have the replicated microstructure pattern 20b. The replicated microstructure pattern 20b can be an inverse of the microstructure pattern 20a of the mold 18. For example, whereas the microstructure pattern 20a includes three separate portions of triangular-shaped indentations; the microstructure pattern 20b includes three separate portions of triangular-shaped protrusions. In an aspect, the second photoresist layer 10b can be adjacent (share a common border), on, and/or nested with the mold 18.

The first photoresist layer 10a and the second photoresist layer 10b can be made of the same material or different materials. In an aspect, the first photoresist layer 10a and the second photoresist layer 10b can be made of the same material but can have different viscosities before application as a layer.

The first multilayer structure 16 can include a substrate 14, a thin film 12, and the first photoresist layer 10a. The thin film 12 can be any thin film, including a single layer of material, and/or a multilayer stack. In an aspect, the thin film 12 can be a high refractive index material thin film, i.e., a thin film made of material having a refractive index from about 2 to about 4. In an aspect, the thin film 12 can have a gradient or continuous variation in the refractive index or a periodic refractive index profile in the material. The thin film 12 can be present at a thickness ranging from about 1 micron to about 20 microns, for example, from about 1 micron to about 15 microns, and, as a further example, from about 3 microns to about 10 microns. The thin film can be present on a surface of the substrate 14 and/or on a surface of the first photoresist layer 10a.

In another aspect, the thin film 12 can be a multilayer stack. The multilayer stack can include one or more layers of a reflector material, a magnetic material, a dielectric material, and an absorbing material.

The substrate 14 can be any material that can receive multiple layers. In an aspect, the substrate 14 can be a transparent material. Non-limiting examples of suitable substrate materials include glass and polymers, such as polycarbonate, polymethylmethacrylate, polyethylene terephthalate, polyethylene, amorphous copolyester, polyvinyl chloride; liquid silicon rubber, cyclic olefin copolymers, ionomer resin, transparent polypropylene, fluorinated ethylene propylene, styrene methyl methacrylate, styrene acrylonitrile resin, polystyrene, and methyl methacrylate acrylonitrile butadiene styrene. The substrate 14 can be present at a thickness ranging from about 50 microns to about 2000 microns, for example, from about 100 microns to about 1500 microns, and, as a further example, from about 150 microns to about 1000 microns.

Figure 1B:
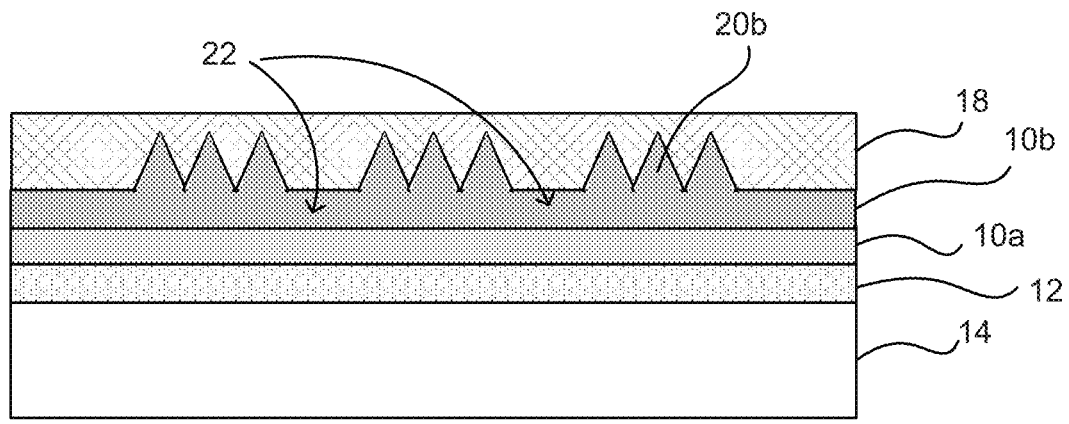
FIG. 1B illustrates a step of combining the first multilayer structure and the second multilayer structure, according to an aspect of the invention.

As shown in FIGS. 1A and 1B, the first multilayer structure 16 and the second multilayer structure 17 can be combined so that the first multilayer structure 16 is in contact with the second multilayer structure 17. In an aspect, an external surface of the second photoresist layer 10b of the second multilayer structure 17 can be adjacent, and/or on an external surface of the first photoresist layer 10a of the first multilayer structure 16.

The method can include applying pressure and temperature to the first multilayer structure 16 while in contact with the second multilayer structure 17. The pressure can range from about 1 PSI to about 20 PSI, for example from about 1 psi to about 15 psi, and as a further example, from about 3 PSI to about 10 PSI. The temperature can range from about 60° C. to about 90° C. for example, from about 65° C. to about 85° C. The contact time can range from about 1 min. to about 60 min, for example, from about 2 min. to about 55 min, and as a further example, from about 5 min. to about 50 min.

Figure 1C:
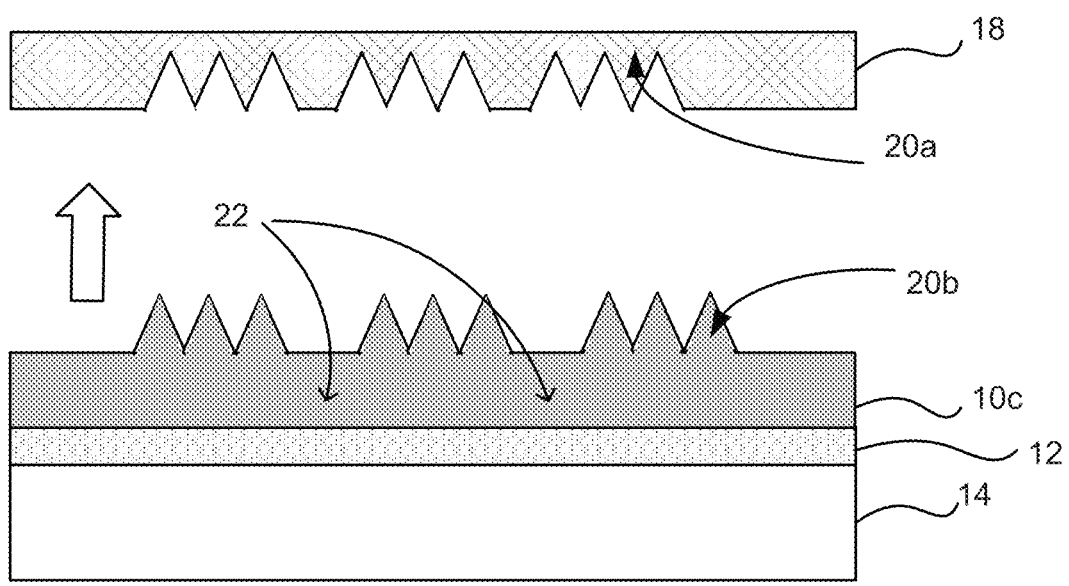
FIG. 1C illustrates a step of removing a mold from the combined first multilayer structure and second multilayer structure.

As shown in FIG. 1C, the method can include removing the mold 18. The first photoresist layer 10a and the second photoresist layer 10b can combine to form a photoresist stack 10c that does not include air pockets or bubbles, for example, between the first multilayer structure 16 and the second multilayer structure 17. The photoresist stack 10c can include the replicated microstructure pattern 20b, and the base portion 22, of the (former) second photoresist layer 10b, that does not have the replicated microstructure pattern 20b.

Figure 1D:
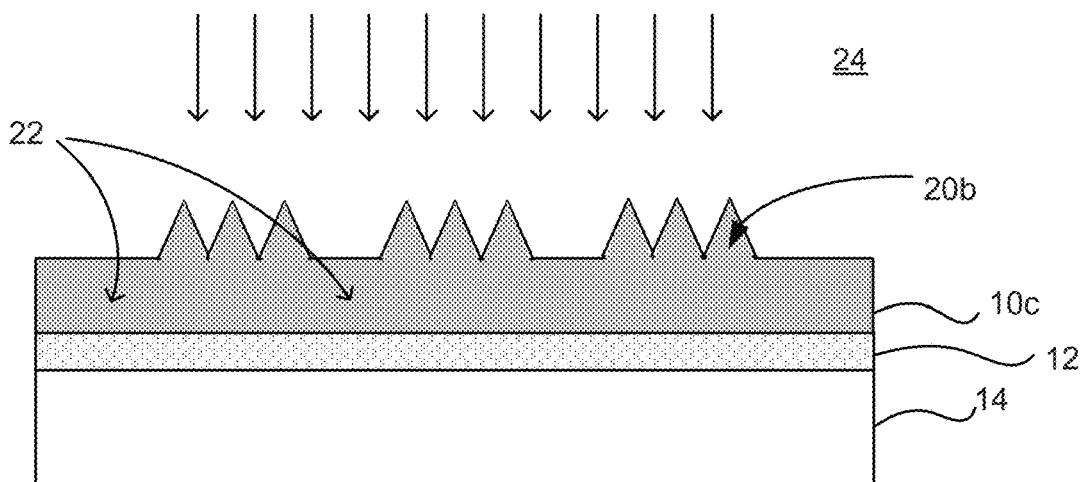
FIG. 1D illustrates applying a flood exposure from a collimated light source to a combined photoresist stack, and developing the photoresist stack to expose a surface portion of the thin film.
Figure 1D:
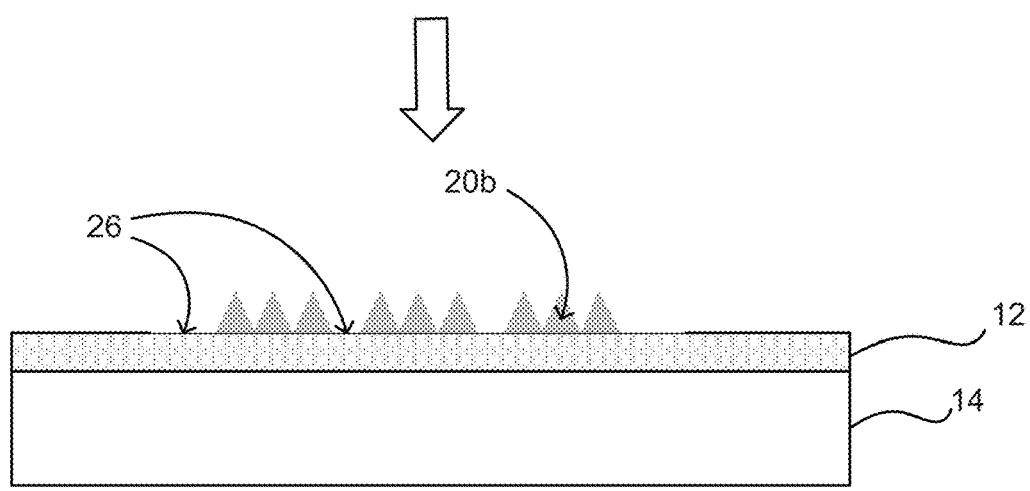
Figure 1E:
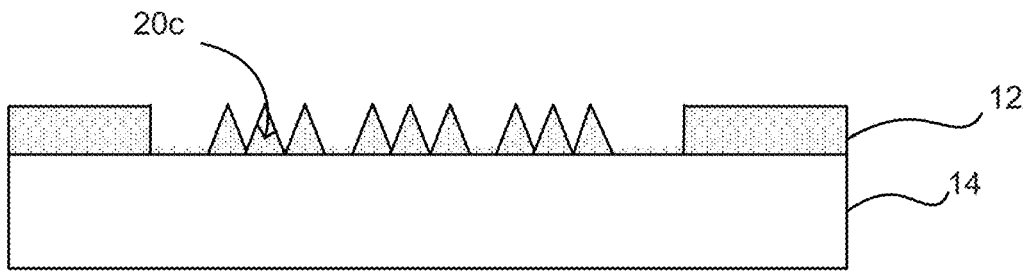
FIG. 1E illustrates etching.

As shown in FIG. 1D, the method can include applying a flood exposure using a collimated light source 24 to the combined photoresist stack 10c, wherein the collimated light 24 exposes the replicated microstructure pattern 20b and the base portion 22 of the photoresist stack 10c that does not have the replicated microstructure pattern 20b. The collimated light source 24 can be a light source that emits collimated light such as a photomask aligner lamp or a dedicated i-line UV exposure tool or a UV-LED/laser setup. In another aspect, the collimated light source can be a source that emits collimated light, such as a lens or mirror that receives diffused light and emits collimated light. The application of a flood exposure can be followed by a subsequent development step to develop off the base portion 22 of the photoresist stack 10c to completion or near completion so that a surface portion 26 of the thin film 12 can be completely exposed or reside a few hundreds of nanometers to a few microns directly below the replicated microstructure pattern 20b. In an aspect, after application of the collimated light followed by a subsequent development step, a structure includes a substrate 14, a thin film 12, and the replicated microstructure pattern 20b, which is adjacent to or on a surface of the thin film 12. In an aspect, the base portion 22 of the photoresist stack 10c is not present. As shown in FIG. 1E, the method also includes etching the photoresist stack 10c and the thin film 12 to form an etched microstructure pattern 20b from the photoresist stack 10c into the thin film 12. After etching, the thin film 12 includes a portion with the replicated microstructure pattern 20c; and/or a portion with an original thickness of the thin film 12. There can be a portion that does not include any thin film 12, i.e., there is an absence of the thin film 12. The step of etching can be performed using any technique that will etch the photoresist material and the underlying thin film 12 simultaneously. Non-limiting examples of suitable etching techniques include reactive ion etching (RIE), Inductively coupled plasma—reactive ion etching (ICP-RIE), and Ion milling.

The etched microstructure pattern 20c in the thin film 12 can have an opposite polarity, and can or cannot have a same aspect ratio as the microstructure pattern 20a of the mold 18. The replicated microstructure pattern 20b in the photoresist stack 10c can have the opposite polarity and can be substantially the same as the microstructure pattern 20a of the mold 18. The etched microstructure pattern 20c in the thin film 12 can have the same polarity and can or cannot have a same aspect ratio as the replicated microstructure pattern 20b in the photoresist stack 10c.

Figure 2A:
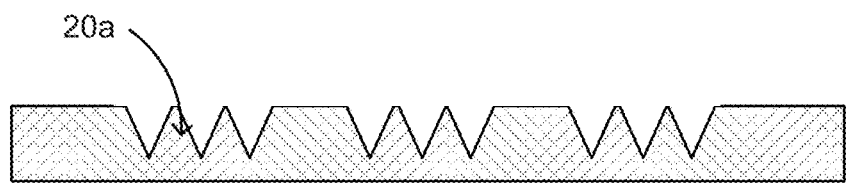
FIG. 2A illustrates a mold.

The method also includes a method of making the second multilayer structure 17. As discussed herein, a mold 18 can include a release agent, applied as a release coating (not shown) to a surface of the mold, for example, a surface of the mold 18 including the microstructure pattern 20a as shown in FIG. 2A. The release agent is disclosed herein. The applied release coating can be exposed to a treatment, such as an ultraviolet ozone treatment or a mild oxygen plasma, to render a surface of the release coating hydrophilic. This can be done to facilitate the application of the photoresist layer 10d onto the mold.

Figure 2B:
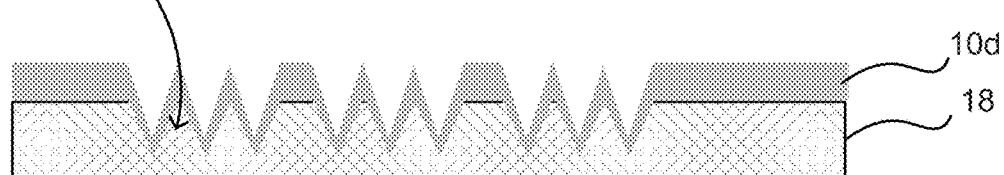
FIG. 2B illustrates applying a third photoresist layer onto the mold of FIG. 2A.

As shown in FIG. 2B, the method can include applying a third photoresist layer 10d onto the release coating. The third photoresist layer 10d can be applied at a thickness sufficient to cover, such as from about 50% to about 100% of coverage, the surface of the mold 18 and/or release coating. The third photoresist layer 10d can applied at a thickness ranging from about 1 micron to about 20 microns, for example, from about 1 micron to about 15 microns, and as a further example, from about 2 microns to about 10 microns. The third photoresist layer 10d can be applied by a deposition process. Non-limiting examples of a deposition process include a spin coat process, a spray coat process, and a dip coat process.

In particular, the third photoresist layer 10d can be applied so that every indentation/protrusion of the microstructure pattern 20a is mimicked in the third photoresist layer 10d. The third photoresist layer 10d can include a surface that conforms to the microstructure pattern 20a of the mold, and can include an opposite surface that is conforming or planar, which can receive a fourth photoresist layer 10e.

After application, the third photoresist layer 10d can be heated/baked at a temperature ranging from about 50° C. to about 90° C., for a period of time ranging from about 1 second to about 30 minutes. The heating/baking can be performed on a hot plate or an oven. In an aspect, the third photoresist layer 10d can be spin coated and baked on a hotplate at 75° C. for about 2 minutes.

Figure 2C:
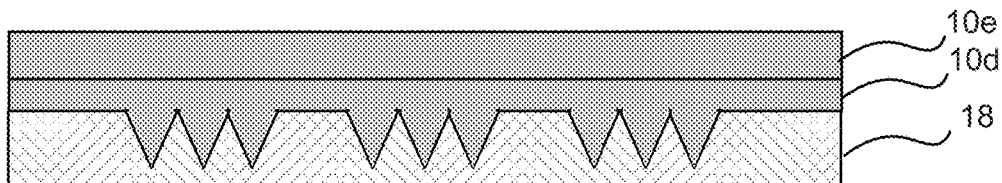
FIG. 2C illustrates applying a fourth photoresist layer.
Figure 2D:
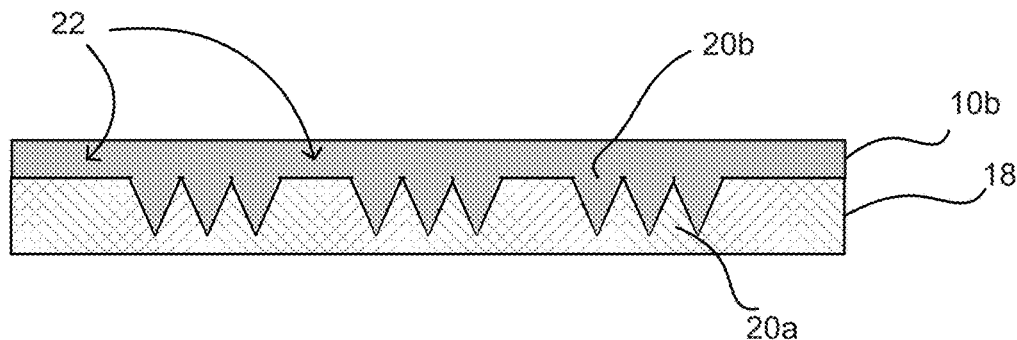
FIG. 2D illustrates the first multilayer structure of FIG. 1A.

After heating/baking the third photoresist layer 10d, a fourth photoresist layer 10e can be applied onto a surface of the third photoresist layer 10d, as shown in FIG. 2C. The third photoresist layer 10d and the fourth photoresist layer 10e can include the same material or different materials. The fourth photoresist layer 10e can be applied to provide a planar external surface. The fourth photoresist layer 10e can be applied at a thickness ranging from about 1 to about 20 microns, for example, from about 1 micron to about 15 microns, and as a further example, from about 2 microns to about 10 microns. The fourth photoresist layer 10e can be applied by a deposition process. Non-limiting examples of a deposition process include a spin coat process, a spray coat process, and a dip coat process. The fourth photoresist layer 10e can be consecutively spin coated and baked on a hotplate at 75° C. for about 2 minutes to form a photoresist stack 10b. Any combinations of heat/bake times and temperatures ranging from 30 seconds to 5 minutes and from 60° C. to 95° C. respectively can be used for baking the photoresist intermediate layers (10d and 10e).

After application of the fourth photoresist layer 10e, the structure (including the mold 18 with an optional release coating, the third photoresist layer 10d, and the fourth photoresist layer 10e) can be heated/baked at a temperature ranging from about 50° C. to about 90° C., for a period of time ranging from about 1 second to about 30 minutes. The heating/baking can be performed on a hot plate or an oven. In this manner, the second multilayer structure 17 can be formed.

Figure 3A:
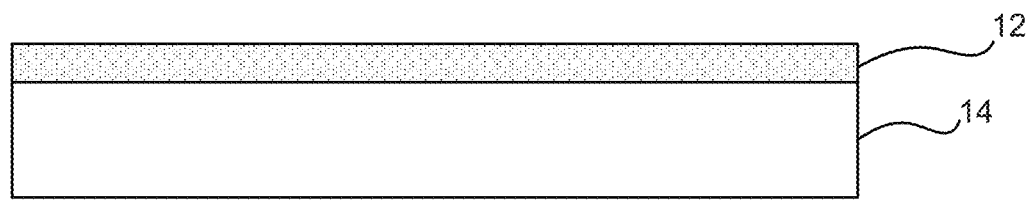
FIG. 3A illustrates applying a thin film onto a substrate.
Figure 3B:
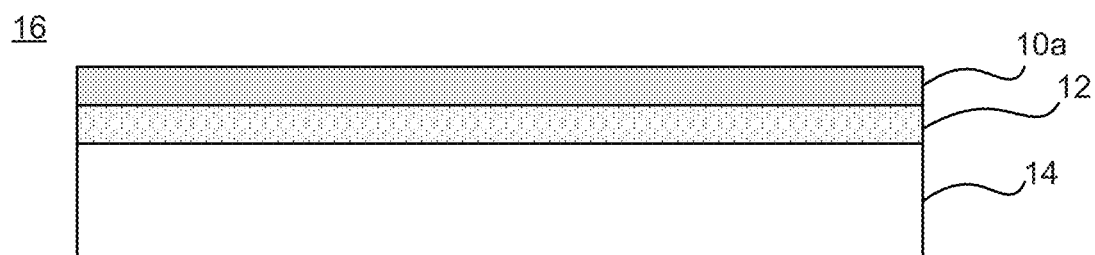
FIG. 3B illustrates applying a photoresist layer onto the thin film to form the second multilayer structure of FIG. 1A.

The method can also include a method for forming the first multilayer structure 16. As shown in FIG. 3A, a thin film 12 can be applied to a surface of a substrate 14. The thin film 12 and the substrate 14 are as described herein. As shown in FIG. 3B, a first photoresist layer 10a can be applied to a surface of the thin film 12 to form the first multilayer structure 16. The first photoresist layer 10a is as described herein. In an aspect, each layer of the first multilayer structure 16 is planar and/or smooth.

An article can include a substrate, and a thin film including a replicated microstructure pattern.

From the foregoing description, those skilled in the art can appreciate that the present teachings can be implemented in a variety of forms. Therefore, while these teachings have been described in connection with particular embodiments and examples thereof, the true scope of the present teachings should not be so limited. Various changes and modifications can be made without departing from the scope of the teachings herein.

This scope disclosure is to be broadly construed. It is intended that this disclosure disclose equivalents, means, systems and methods to achieve the coatings, devices, activities and mechanical actions disclosed herein. For each coating, device, layer, article, method, mean, mechanical element or mechanism disclosed, it is intended that this disclosure also encompass in its disclosure and teaches equivalents, means, systems and methods for practicing the many aspects, mechanisms and devices disclosed herein. Additionally, this disclosure regards a method and an article formed by the method and its many aspects, features and elements. This disclosure is intended to encompass the equivalents, means, systems and methods of the use of an article, such as an optical device and its many aspects consistent with the description and spirit of the operations and functions disclosed herein. The claims of this application are likewise to be broadly construed. The description of the inventions herein in their many embodiments is merely exemplary in nature and, thus, variations that do not depart from the gist of the invention are intended to be within the scope of the invention. Such variations are not to be regarded as a departure from the spirit and scope of the invention.

What is claimed is:

1. A method, comprising:
providing a first multilayer structure including a substrate, a thin film, and a first photoresist layer;
providing a second multilayer structure including a mold having a microstructure pattern, and a second photoresist layer;
combining the first multilayer structure and the second multilayer structure so that the first photoresist layer is in contact with the second photoresist layer; and
applying pressure and temperature to form a photoresist stack, the photoresist stack having a replicated microstructure pattern, and a base portion that does not have the replicated microstructure pattern;

removing the mold;

after removing the mold, applying a flood exposure using a collimated light source to the photoresist stack, wherein collimated light exposes the replicated microstructure pattern and the base portion of the photoresist stack that does not have the replicated microstructure pattern; and etching the photoresist stack and the thin film to form an etched microstructure pattern from the photoresist stack into the thin film.

2. The method of claim 1, wherein the second photoresist layer has the replicated microstructure pattern, and the base portion that does not have the replicated microstructure pattern.

3. The method of claim 1, wherein the thin film is a high refractive index material thin film.

4. The method of claim 1, wherein the mold having the microstructure pattern is coated with a release agent.

5. The method of claim 1, wherein the mold is made of a material chosen from metal, semiconductor, dielectric, or combinations thereof.

6. The method of claim 1, wherein the first photoresist layer and the second photoresist layer are made of the same material or different materials.

7. The method of claim 1, wherein the photoresist stack does not include air pockets.

8. The method of claim 1, further comprising, developing the photoresist stack.

9. The method of claim 1, wherein the step of etching is chosen from a reactive ion etching, an Inductively Coupled Plasma-Reactive Ion Etching process, and an ion milling step.

10. The method of claim 1, wherein the etched microstructure pattern in the thin film while having an opposite polarity may or may not have a same aspect ratio as the microstructure pattern of the mold;

wherein the replicated microstructure pattern in the photoresist stack while having the opposite polarity is substantially the same as the microstructure pattern of the mold; and wherein the etched microstructure pattern in the thin film while having a same polarity may or may not have a same aspect ratio as the replicated microstructure pattern in the photoresist stack.

11. The method of claim 1, wherein prior to forming the second photoresist layer, the second multilayer structure is formed by applying a release coating to the mold; and exposing the applied release coating to a treatment to render a surface of the release coating hydrophilic.

12. The method of claim 11, wherein the second photoresist is formed by:

applying a first photoresist sublayer onto the release coating;

heating the first photoresist sublayer; and after heating the first photoresist sublayer, applying a second photoresist sublayer onto the first photoresist sublayer.

13. The method of claim 12, wherein the first photoresist sublayer is applied at a thickness ranging from about 1 to about 20 microns.

14. The method of claim 12, wherein the heating the first photoresist sublayer comprises heating at a temperature ranging from about 50° C. to about 90° C., for a period of time ranging from about 1 second to about 30 minutes.

15. The method of claim 12, wherein the second photoresist sublayer is applied at a thickness ranging from about 1 to about 20 microns.

16. The method of claim 12, further comprising after applying the second photoresist sublayer, heating at a temperature ranging from about 50° C. to about 90° C., for a period of time ranging from about 1 second to about 30 minutes.

17. The method of claim 8, wherein the photoresist stack is a positive tone photoresist.

18. The method of claim 1, wherein the photoresist stack is a positive tone photoresist.

* * * * *